US012349561B2

(12) United States Patent
Yu et al.

(10) Patent No.: US 12,349,561 B2
(45) Date of Patent: Jul. 1, 2025

(54) DISPLAY PANEL WITH TRANSISTOR DISPOSED IN REGION CORRESPONDING TO DATA LINE

(71) Applicant: WUHAN CHINA STAR OPTOELECTRONICS TECHNOLOGY CO., LTD., Wuhan (CN)

(72) Inventors: Wenqiang Yu, Wuhan (CN); Chao Wang, Wuhan (CN); Guanghui Liu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 660 days.

(21) Appl. No.: 17/280,912

(22) PCT Filed: Feb. 24, 2021

(86) PCT No.: PCT/CN2021/077547
§ 371 (c)(1),
(2) Date: Mar. 28, 2021

(87) PCT Pub. No.: WO2022/151565
PCT Pub. Date: Jul. 21, 2022

(65) Prior Publication Data
US 2023/0094885 A1    Mar. 30, 2023

(30) Foreign Application Priority Data

Jan. 15, 2021 (CN) .............. 20110057584.6

(51) Int. Cl.
*H10K 59/131* (2023.01)
*H10K 59/123* (2023.01)

(52) U.S. Cl.
CPC ......... *H10K 59/131* (2023.02); *H10K 59/123* (2023.02)

(58) Field of Classification Search
CPC .............. H10K 59/131; H10K 59/123; H10K 59/1213; H10K 59/1315; H01L 27/1222;
(Continued)

(56) References Cited

U.S. PATENT DOCUMENTS 11,322,521 B2 * 5/2022 Nie ................. H01L 27/124
2004/0183978 A1   9/2004 Jeoung
(Continued)

FOREIGN PATENT DOCUMENTS

CN         1901204 A       1/2007
CN         102117824 A     7/2011
(Continued)

OTHER PUBLICATIONS

"Parallel." Merriam-Webster.com Dictionary, Merriam-Webster, https://www.merriam-webster.com/dictionary/parallel. Accessed Mar. 18, 2024. (Year: 2024).*

(Continued)

*Primary Examiner* — Davienne N Monbleau
*Assistant Examiner* — John Patrick Cornely
(74) *Attorney, Agent, or Firm* — PV IP PC; Wei Te Chung

(57) ABSTRACT

A display panel is provided. The display panel includes a substrate, and a data line and a transistor electrically connected to the data line and on the substrate, and the transistor includes a patterned active layer and a conductive line. The patterned active layer of the transistor is disposed in a region corresponding to the data line. The patterned active layer includes a source contact region, the conductive line includes a first conductive line that is a source electrically connected to the patterned active layer corresponding to the (Continued)

source contact region, and an orthographic projection of the source on the substrate is located within an orthographic projection of the data line on the substrate.

19 Claims, 5 Drawing Sheets

(58) Field of Classification Search
CPC ..... H01L 27/124; H01L 27/1244; G09F 9/30; G02F 1/1362; H10D 86/421; H10D 86/441; H10D 86/60; H10D 86/443
See application file for complete search history.

(56) References Cited

U.S. PATENT DOCUMENTS

| | | | |
|---|---|---|---|
| 2015/0227013 A1 | 8/2015 | Hao et al. | |
| 2018/0190671 A1 | 7/2018 | Long et al. | |
| 2019/0326332 A1* | 10/2019 | Li | H01L 29/78675 |
| 2020/0321427 A1* | 10/2020 | Park | H10K 59/1315 |
| 2022/0317528 A1* | 10/2022 | Zhou | G02F 1/1368 |

FOREIGN PATENT DOCUMENTS

| | | |
|---|---|---|
| CN | 103472646 A | 12/2013 |
| CN | 108470717 A | 8/2018 |
| CN | 109683743 A | 4/2019 |
| CN | 110061013 A | 7/2019 |
| CN | 111128025 A | 5/2020 |
| CN | 111312726 A | 6/2020 |
| CN | 214279455 U | 9/2021 |
| KR | 20150051351 A | 5/2015 |

OTHER PUBLICATIONS

International Search Report in International application No. PCT/CN2021/077547, mailed on Oct. 14, 2021.

Written Opinion of the International Search Authority in International application No. PCT/CN2021/077547, mailed on Oct. 14, 2021.

Chinese Office Action issued in corresponding Chinese Patent Application No. 202110057584.6 dated Oct. 10, 2024, pp. 1-9.

* cited by examiner

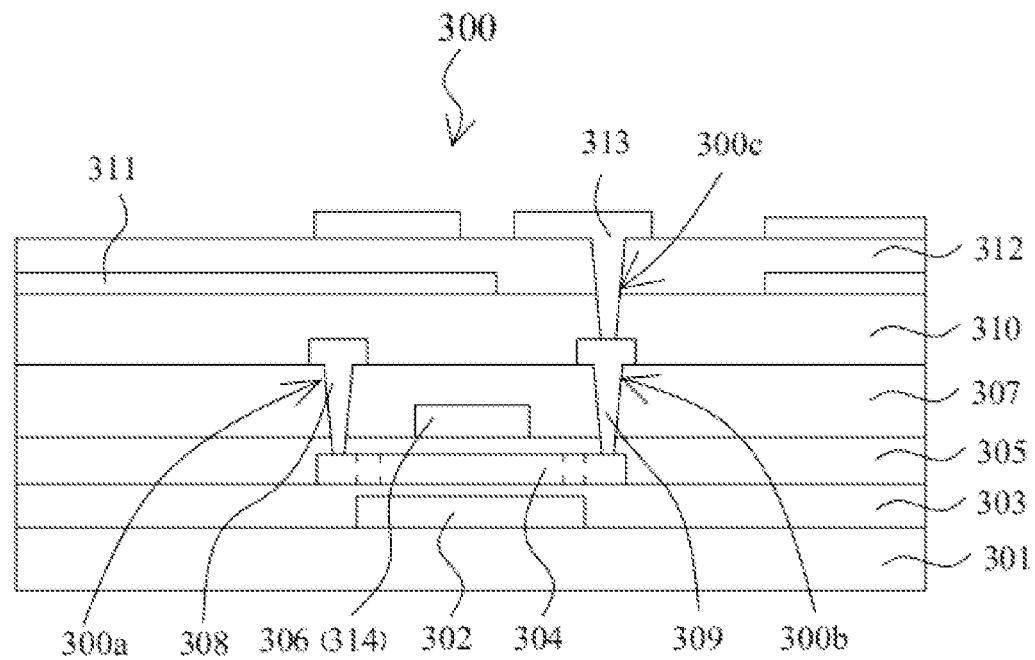
FIG. 1, Prior Art
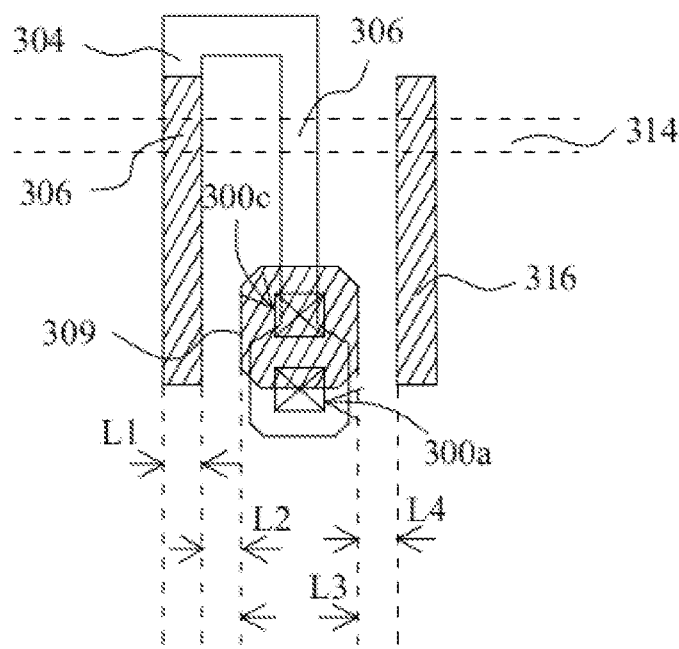
FIG. 2, Prior Art

US 12,349,561 B2

1

DISPLAY PANEL WITH TRANSISTOR DISPOSED IN REGION CORRESPONDING TO DATA LINE

RELATED APPLICATIONS

This application is a National Phase of PCT Patent Application No. PCT/CN2021/077547 having international filing date of Feb. 24, 2021, which claims the benefit of priority of Chinese Patent Application No. 202110057584.6 filed on Jan. 15, 2021. The contents of the above applications are all incorporated by reference as if fully set forth herein in their entirety.

BACKGROUND OF INVENTION

Field of Invention

The present invention relates to a field of display technology, and more particularly, to a display panel.

Description of Prior Art

Currently, virtual reality technology has been introduced in the military and aviation fields. High resolution is a development trend of virtual reality technology. The resolution of about 1000 introduced in the market still cannot meet the demand of virtual reality technology for high resolution.

Therefore, it is necessary to provide a technical solution to improve the resolution.

SUMMARY OF INVENTION

In order to achieve the above objectives, the technical solutions are as follows:

A display panel comprises a data line and a transistor electrically connected to the data line. The transistor comprises a patterned active layer. The patterned active layer of the transistor is disposed in a region corresponding to the data line.

A display panel comprises a data line and a transistor electrically connected to the data line. The transistor is disposed in a region corresponding to the data line.

The present application provides a display panel. A patterned active layer of a transistor electrically connected to a data line is disposed in a region corresponding to the data line, so that the patterned active layer and the data line are overlapped to reduce the layout space required for the two, and the width of the repeating unit is reduced, which is beneficial to the display panel to realize high-resolution display.

In addition, the overlapping of the patterned active layer and the data line provide conditions for the overlap of the part of the transistor with the data line except for the patterned active layer, which is more beneficial to the display panel to realize high-resolution display.

BRIEF DESCRIPTION OF DRAWINGS

FIG. 1 is a schematic cross-sectional view of a display panel in the prior art.

FIG. 2 is a schematic plan view of the display panel shown in FIG. 1.

2

Figure 3:
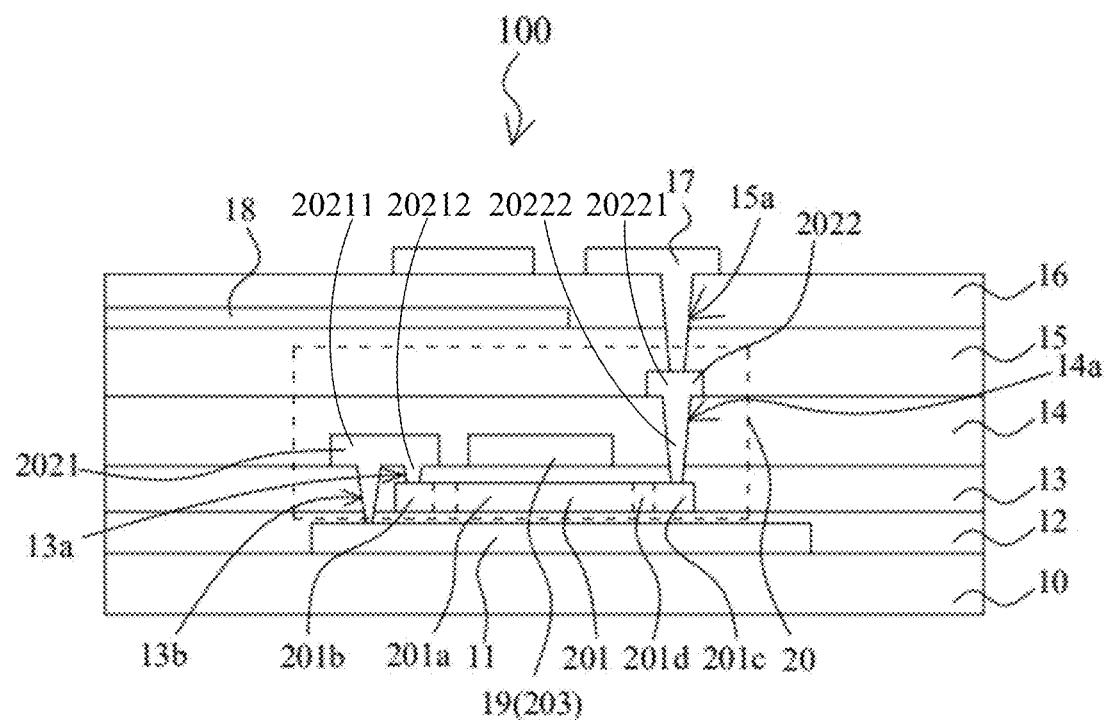
FIG. 3 is a schematic cross-sectional view of the display panel according to first embodiment of the present invention.
Figure 4:
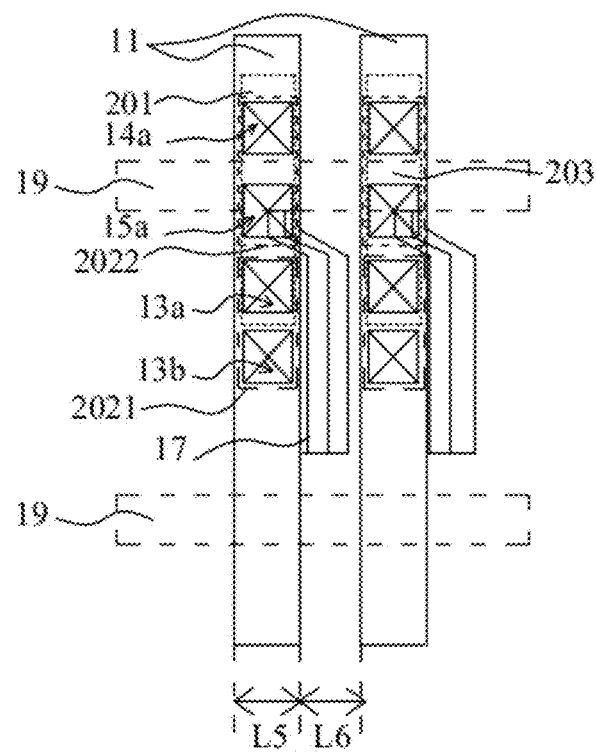

FIG. 4 is a schematic plan view of the display panel in FIG. 3.

Figure 5:
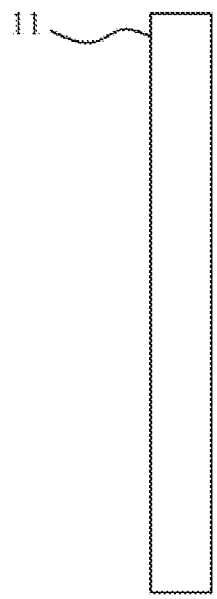

FIG. 5 is a schematic plan view of the data line in FIG. 4.

Figure 6:
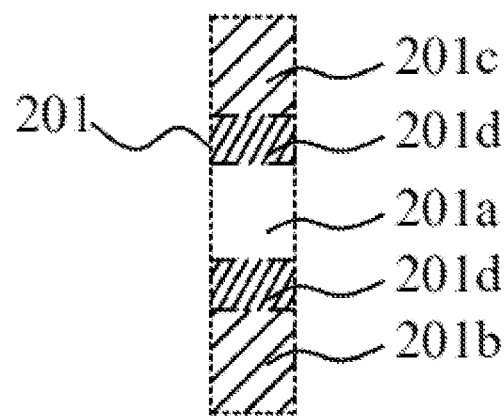
Figure 7:
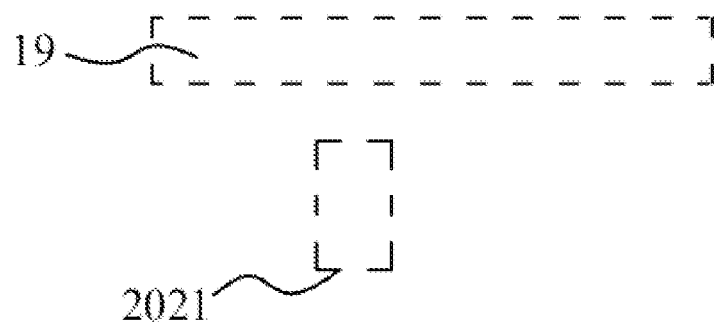

FIG. 6 is a schematic plan view of a patterned active layer in FIG. 4;

FIG. 7 is a schematic plan view of the first conductive line and the scan line in FIG. 4.

Figure 8:
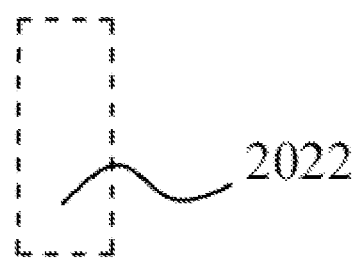

FIG. 8 is a schematic plan view of second conductive line in FIG. 4.

Figure 9:
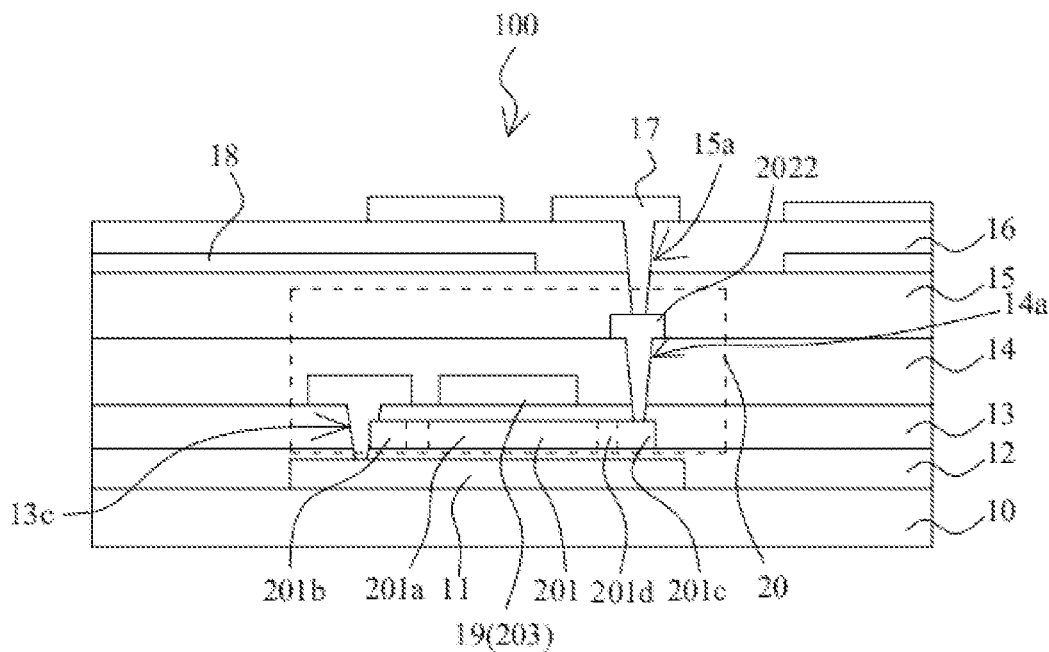

FIG. 9 is a schematic cross-sectional view of a display panel according to second embodiment of the present invention.

Figure 10:
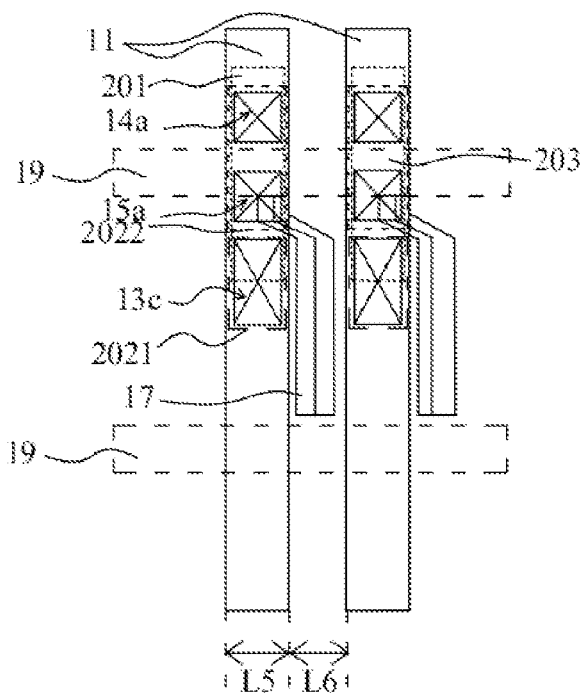

FIG. 10 is a schematic plan view of the display panel shown in FIG. 9.

Figure 11:
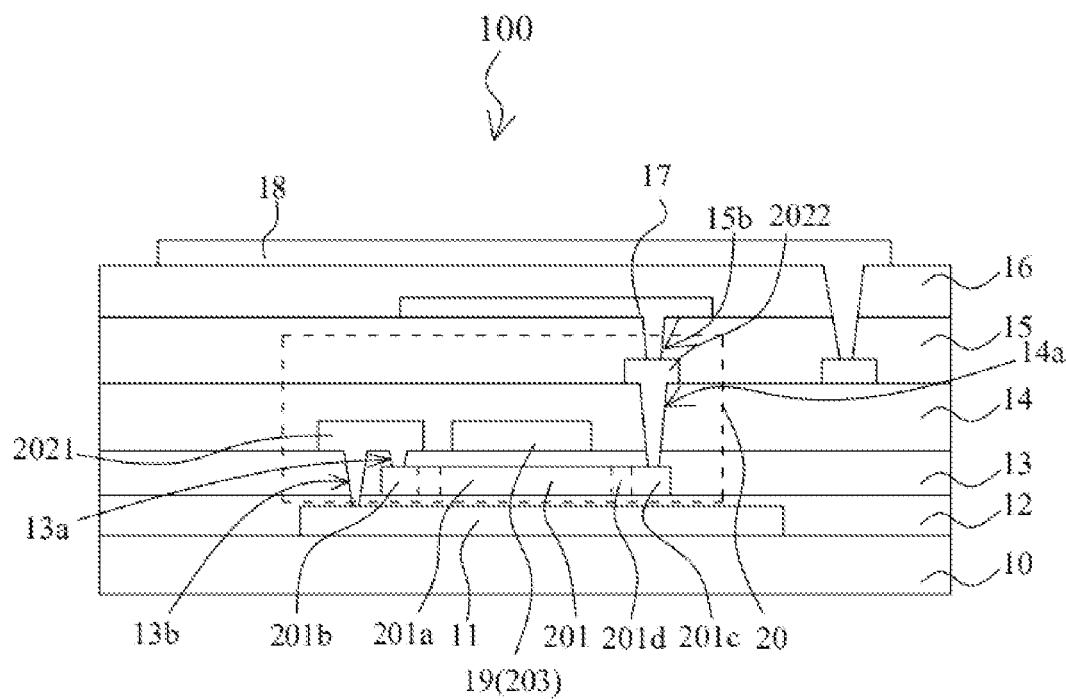

FIG. 11 is a schematic cross-sectional view of a display panel according to third embodiment of the present invention.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work fall within the claimed scope of this application.

Referring to FIG. 1 and FIG. 2, FIG. 1 is a schematic cross-sectional view of a display panel in the prior art, and FIG. 2 is a schematic plan view of the display panel shown in FIG. 1. In the prior art, the display panel 300 includes a substrate 301, a light shielding layer 302, a buffer layer 303, a patterned active layer 304, a gate insulating layer 305, a gate 306, an interlayer insulating layer 307, a source 308, and a drain 309, a first passivation layer 310, a common electrode 311, a second passivation layer 312, a pixel electrode 313, a scan line 314, and a data line 316.

The light shielding layer 302 is disposed on the substrate 301. The buffer layer 303 covers the light shielding layer 302 and the substrate 301. The patterned active layer 304 is disposed on the buffer layer 303 and a channel of the patterned active layer 304 is shielded by the light shielding layer 302, and the patterned active layer 304 is a U-shaped layer. The gate insulating layer 305 covers the patterned active layer 304 and the buffer layer 303. The scan line 314 is disposed on the gate insulating layer 305. Overlapping parts of the scan line 314 and the patterned active layer 304 are two gates. Overlapping parts of the patterned active layer 304 and the scan line 314 are two channels.

The interlayer insulating layer 307 covers the gate insulating layer 305 and the gate 306. The source 308 and the drain 309 are disposed on the interlayer insulating layer 307.

The source 308 is electrically connected to a part of the patterned active layer 304 corresponding to the source contact region by penetrating through the interlayer insulating layer 307 and the seventh via hole 300a of the gate insulating layer 305. The drain 309 is electrically connected to a part of the patterned active layer 304 corresponding to the drain contact region by penetrating through the interlayer insulating layer 307 and the eighth via hole 300b of the gate insulating layer 305. The data line 316, the source 308, and the drain 309 are disposed in the same layer. The first passivation layer 310 covers the source 308, the drain 309, and the interlayer insulating layer 307. The common electrode 311 is disposed on the first passivation layer 310. The second passivation layer 312 covers the first passivation layer 310 and the common electrode 311. The pixel electrode 313 is electrically connected to the drain 309 by penetrating through the ninth via hole 300c of the first passivation layer 310 and the second passivation layer 312. In the prior art, the drain 309 is disposed between two adjacent data lines 316, a width of the data line 316 is L1, a distance between the drain 309 and an adjacent data line 316 is L2, a width of the drain 309 is L3, a distance between the drain 309 and another adjacent data line 316 is L4, and a width of a repeating unit formed by a data line, a transistor electrically connected to the data line, and a pixel electrode is L1+L2+L3+L4.

Limited by the process capabilities of panel exposure, etc., a minimum metal line width can only be about 1.5 microns, a minimum size of via holes on the inorganic insulating layer is about 2 microns, and a minimum size of via holes on the organic insulating layer is 3 microns to 5 microns. As a result, the minimum value of L1+L2+L3+L4 is 7 microns to 8 microns. Correspondingly, the maximum resolution can only reach about 1000, and the resolution of about 1000 cannot meet the immersive demand of virtual reality technology.

As for the problems in the prior art, the display panel of the present invention and the patterned active layer of the transistor electrically connected to the data line are disposed in the region corresponding to the data line to reduce the repeating unit composed of the data line, the transistor electrically connected to the data line, and the pixel electrode, and the source and the drain electrically connected to the patterned active layer are also arranged in the region corresponding to the data line. In addition, different via holes, which are required for electrically connecting the source and the data line, electrically connecting the source and the patterned active layer, electrically connecting the drain and the patterned active layer, and electrically connecting the drain and the pixel electrode, are disposed in the region corresponding to the data line. Therefore, the transistor electrically connected to the data line is disposed in the region corresponding to the data line, and the pixel electrode is mainly disposed between two adjacent data lines. The minimum width of the repeating unit is about 4 micrometers based on the currently process capability, and the resolution can reach more than 2000, so that the resolution of the display panel is significantly improved and meets the demand for high resolution in the virtual reality field.

Referring to FIG. 3 and FIG. 4, FIG. 3 is a schematic cross-sectional view of the display panel according to first embodiment of the present invention, and FIG. 4 is a schematic plan view of the display panel shown in FIG. 3.

It can be understood that the display panel 100 may also be an organic light emitting diode display panel. The display panel 100 includes a substrate 10, a data line 11, a buffer layer 12, a gate insulating layer 13, an interlayer insulating layer 14, a first passivation layer 15, a second passivation layer 16, a transistor 20, a pixel electrode 17, a common electrode 18, and scan line 19. The display panel 100 includes a plurality of repeating units arranged in an array, and each repeating unit includes a data line 11, a transistor 20 and a pixel electrode 17, and the transistor 20 is electrically connected to the data line 11 and the pixel electrode 17.

In this embodiment, the substrate 10 is a glass substrate. It can be understood that the substrate 10 may also be a flexible substrate 10.

In this embodiment, the data line 11 is disposed on the substrate 10, and the data line 11 is disposed in the metal film layer where the traditional light shielding layer is located, which provides conditions for the data line 11 and the transistor 20 to overlap in the thickness direction of the display panel 100. While the data line 11 has functions of transmitting data signals, the data line 11 also has functions of shielding light. As shown in FIG. 4 and FIG. 5, FIG. 5 is a schematic plan view of the data line in FIG. 4. The data lines 11 have a linear strip shape, and each data line 11 extends in a vertical direction, and a plurality of data lines 11 are arranged side by side in parallel.

In this embodiment, a thickness of the data line 11 is greater than 500 angstroms, which is different to the traditional light shielding layer having a thickness of 500 angstroms, so that the impedance of the data line 11 meets the requirements for transmitting data signals. A thickness of the data line 11 is 2000-4000 angstroms, for example, the thickness of the data line 11 is 3000 angstroms. The material of the data line 11 is selected from at least one of molybdenum, aluminum, titanium, copper, and silver.

In this embodiment, the transistor 20 is electrically connected to the data line 11 and the pixel electrode 17, and the transistor 20 acts as a switch to control whether the data signal transmitted by the data line 11 is transmitted to the pixel electrode 17. The transistor 20 is a low temperature polysilicon transistor. It can be understood that the transistor 20 may also be a metal oxide transistor or an amorphous silicon transistor. Furthermore, the transistor 20 includes a patterned active layer 201, a conductive line, and a gate.

In this embodiment, the patterned active layer 201 is disposed in a region corresponding to the data line 11, that is, the patterned active layer 201 and the data line 11 are stacked in a thickness direction of the display panel 100. Specifically, as shown in FIGS. 4 and 6, the patterned active layer 201 adopts the same linear strip design as the data line 11 and is arranged in parallel with the data line 11.

In the present invention, the patterned active layer 201 and the data line 11 are overlapped to reduce the space required for the patterned active layer and the data line, so that a width of the repeating unit formed by the data line, the transistor electrically connected to the data line, and the pixel electrode is greatly reduced, which is beneficial to the improvement of the resolution of the display panel 100. In addition, the overlapping of the patterned active layer 201 and the data line 11 provides a condition for the source and drain of the transistor to be arranged in the region corresponding to the data line.

Furthermore, an orthographic projection of the patterned active layer 201 on the substrate 10 is located within an orthographic projection of the data line 11 on the substrate 10. That is, a width of the data line 11 is greater than a width of the patterned active layer 201, and a length of the data line 11 is greater than a length of the corresponding patterned active layer 201, so that the data line 11 can completely shield the light incident to the channel of the patterned active layer 201, and it can avoid the risk of slope problem in the patterned active layer 201, thereby avoiding the rapid thermal annealing crystallization failure of the patterned active layer 201.

In this embodiment, the buffer layer 12 is disposed between the patterned active layer 201 and the data line 11. The buffer layer 12 is an insulating layer. The preparation material of the buffer layer 12 is selected from at least one of silicon nitride and silicon oxide. Specifically, the buffer layer 12 covers the substrate 10 and the data line 11, and the patterned active layer 201 is disposed on the buffer layer 12 and directly above the data line 11.

In this embodiment, the patterned active layer 201 includes a channel region 201a, a source contact region 201b, a drain contact region 201c, and a lightly doped region 201d. Among them, one lightly doped region 201d is disposed between the source contact region 201b and the channel region 201a, and the other lightly doped region 201d is disposed between the drain contact region 201c and the channel region 201a.

In this embodiment, the conductive line is electrically connected to the patterned active layer 201, and the conductive line is disposed in the region corresponding to the data line 11. The conductive line may be a source electrically connected to a part of the patterned active layer 201 corresponding to the source contact area 201b, the conductive line may also be a drain electrically connected to a part of the patterned active layer 201 corresponding to the drain contact area 201c, and the conductive line may also be a source and a drain electrically connected to the patterned active layer 201. Based on that the patterned active layer 201 overlaps the data line 11, at least one of the source and the drain electrically connected to the patterned active layer 201 may also overlap the data line 11, so as to reduce the width of a repeating unit.

Specifically, the conductive line includes a first conductive line 2021 and a second conductive line 2022. The first conductive line 2021 serves as a source and being electrically connected to the data line 11 and a part of the patterned active layer 201 corresponding to the source contact region 201b. The second conductive line 2022 serves as a drain and being electrically connected to the pixel electrode 17 and a part of the patterned active layer 201 corresponding to the drain contact region 201c.

In this embodiment, the gate insulating layer 13 is disposed between the patterned active layer 201 and the first conductive line 2021. The preparation material of the gate insulating layer 13 is selected from at least one of silicon nitride and silicon oxide.

Specifically, the gate insulating layer 13 covers the patterned active layer 201 and the buffer layer 12, and the first conductive line 2021 is disposed on the gate insulating layer 13. The first conductive line 2021 has a linear strip shape, the first wire 2021 is parallel to the data line 11, and the first conductive line 2021 is disposed in a region corresponding to the data line 11. For example, an orthographic projection of the first conductive line 2021 on the substrate 10 is located within an orthographic projection of the data line 11 on the substrate 10.

In this embodiment, a first via hole 13a is defined on the gate insulating layer 13, the first conductive line 2021 is electrically connected to a part of the patterned active layer 201 corresponding to the source contact region 201b through the first via hole, and the first via hole 13a is defined in a region corresponding to the data line 11, so as to further reduce the width of the repeating unit and increasing the resolution. Specifically, an orthographic projection of the first via hole 13a on the substrate 10 is located within an orthographic projection of the data line 11 on the substrate 10. In some embodiments, the first conductive line 2021 is a source, the source includes a first source portion 20211 and a second source portion 20212 connected to the first source portion 20211, the first source portion 20211 is disposed on a surface of the gate insulating layer 13 away from the substrate 10, and the second source portion 20212 penetrates the first via 13a and is connected to the patterned active layer 201; and in a plan view, extension directions of the patterned active layer 201, the first source portion 20211, and the data line 11 are same, and both of an orthographic projection of the patterned active layer 201 on the substrate 10 and an orthographic projection of the first source portion 20211 on the substrate 10 are located within an orthographic projection of the data line 11 on the substrate 10.

In this embodiment, the first conductive line 2021 is electrically connected to the data line 11 through a second via 13b penetrating the gate insulating layer 13 and the buffer layer 12, and the second via 13b is defined in a region corresponding to the data line 11, so as to further reduce the width of the repeating unit, and further improving the resolution. Specifically, an orthographic projection of the second via 13b on the substrate 10 is located within an orthographic projection of the data line 11 on the substrate 10.

In this embodiment, as shown in FIG. 4 and FIG. 7, the scan line 19 and the first conductive line 2021 are in the same layer and disposed separately, so that the first conductive line 2021 and the data line 11 can be overlapped, which is beneficial to reduce the width of the repeating unit. In addition, when the data line 11 is disposed on the layer where the traditional light-shielding film layer is located, the scan line 19 and the first conductive line 2021 are disposed in the same layer, which is beneficial for the first conductive line 2021 to electrically connect the data line 11 to a part of the patterned active layer 201 corresponding to the source contact region 201b.

The scan line 19 is insulated from the data line 11 and intersects perpendicularly. The intersection of the patterned active layer 201 and the scan line 19 corresponds to the channel region 201a of the patterned active layer 201, and the intersection of the scan line 19 and the patterned active layer 201 corresponds to the gate 203 of the patterned active layer 201. Since the patterned active layer 201 perpendicularly intersects the scan line 19, the patterned active layer 201 has only one channel region 201a. Correspondingly, the transistor 20 has a gate. Compared with the traditional transistor having two gates, the transistor 20 with one gate in the present invention is also feasible as a switch.

It should be noted that the data line 11 below the channel region 201a of the patterned active layer 201 inputs a data signal. When the gate 203 of the transistor 20 is turned off, the 5V data signal transmitted by the data line 11 causes the part of the transistor 20 corresponding to the channel region 201a to turn on again, and then the leakage of the transistor 20 may be occurred. This risk can be solved by reducing the turn-off voltage on the gate 203.

In this embodiment, the interlayer insulating layer 14 is disposed between the first conductive line 2021 and the second conductive line 2022, and a part of the second conductive line 2022 is electrically connected to the patterned active layer 201 corresponding to the drain contact region 201c through the third via hole 14a. The third via hole 14a penetrates the interlayer insulating layer 14 and the gate insulating layer 13, and the third via hole 14a is defined in a region corresponding to the data line 11, so as to further reduce the width of the repeating unit, thereby improving the resolution rate.

Specifically, as shown in FIG. 4 and FIG. 8, the second conductive line 2022 is disposed on the interlayer insulating layer 14, and the second conductive line 2022 is disposed corresponding to the data line 11. An orthographic projection of the third via hole 14a on the substrate is located within an orthographic projection of the data line 11 on the substrate. The preparation material of the interlayer insulating layer 14 is selected from at least one of silicon nitride and silicon oxide. In some embodiments, the second conductive line 2022 is a drain, the drain includes a first drain portion 20221 and a second drain portion 20222 connected to the first drain portion 20221; the first drain portion 20221 is disposed on a surface of the interlayer insulating layer 14 away from the substrate 10, and the second drain portion 20222 penetrates the third via hole 14a and is connected to the patterned active layer 201; the gate 203 is disposed on a surface of the gate insulating layer 13 and spaced apart with the first source portion 20211, and in a direction perpendicular to the substrate 10, an orthographic projection of the first source portion 20211 on the second drain portion 20222 overlaps with an orthographic projection of the gate 203 on the second drain portion 20222.

In this embodiment, the first passivation layer 15 and the second passivation layer 16 are disposed between the second conductive line 2022 and the pixel electrode 17, the first passivation layer 15 is disposed close to the second conductive line 2022, and the second passivation layer 16 is disposed close to the pixel electrode 17. The pixel electrode 17 and the second conductive line 2022 are electrically connected through a fourth via hole 15a that penetrates the first passivation layer 15 and the second passivation layer 16, and the fourth via hole 15a is disposed in a region corresponding to the data line 11. The pixel electrode 17 is disposed on a side of the common electrode 18 away from the transistor 20.

Specifically, the first passivation layer 15 covers the second conductive line 2022 and the interlayer insulating layer 14. The common electrode 18 is disposed on the first passivation layer 15. The second passivation layer 16 covers the common electrode 18 and the first passivation layer 15. The pixel electrode 17 is disposed on the second passivation layer 16. An orthographic projection of the fourth via hole 15a on the substrate is located within an orthographic projection of the data line 11 on the substrate. Among them, the first passivation layer 15 is an inorganic insulating layer, and the second passivation layer 16 is also an inorganic insulating layer.

It can be understood that the first passivation layer 15 may be an organic insulating layer, and the second passivation layer 16 is an inorganic insulating layer. Because the first passivation layer 15 is an inorganic insulating layer, the size of the fourth via hole 15a is about 1.5 microns. The first passivation layer 15 is an organic insulating layer, so that the size of the fourth via hole 15a is about 3 microns to 5 microns. The first passivation layer 15 is an organic insulating layer, which causes the fourth via hole 15a to occupy more space.

In this embodiment, the pixel electrode 17 is disposed in an region between two adjacent data lines 11. The pixel electrode 17 and the common electrode 18 are made of transparent metal oxide.

In this embodiment, a width of a repeating unit is equal to the sum of the width L5 of the data line 11 and the distance L6 between two adjacent data lines 11. The distance L6 between two adjacent data lines 11 mainly depends on the width of the pixel electrode. The minimum value of L5+L6 can be about 4 microns under the current process capability of the display panel.

In the display panel of this embodiment, the patterned active layer of the transistor is disposed in the region corresponding to the data line electrically connected to the transistor.

The first conductive line electrically connecting the patterned active layer and the data line with corresponding via hole, the second connective line electrically connecting the patterned active layer and the pixel electrode with the corresponding via hole are all disposed in the region corresponding to the data line, so as to minimize the width of the repeating unit.

Referring to FIG. 9 and FIG. 10, FIG. 9 is a schematic cross-sectional view of a display panel according to second embodiment of the present invention, and FIG. 10 is a schematic plan view of the display panel shown in FIG. 9. The display panel shown in FIG. 9 is basically similar to the display panel shown in FIG. 3, except that the first conductive line 2021 is electrically connected to the data line 11 and a part of the patterned active layer corresponding to the source contact region 201b through the fifth via 13c penetrating the buffer layer 12 and the gate insulating layer 13 at the same time.

Referring to FIG. 11, FIG. 11 is a schematic cross-sectional view of a display panel according to third embodiment of the present invention. The display panel shown in FIG. 11 is basically similar to the display panel shown in FIG. 3, except that the pixel electrode 17 is disposed on the first passivation layer 15, the common electrode 18 is disposed on the second passivation layer 16, and the pixel electrode 17 is electrically connected to the second conductive line 2022 through the sixth via hole 15b penetrating the first passivation layer 15, that is, the common electrode 18 is disposed on a side of the pixel electrode 17 away from the transistor 20.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel comprising:
   a substrate;
   a plurality of data lines disposed on the substrate; and
   a transistor disposed on the substrate and electrically connected to one of the plurality of data lines, wherein the transistor comprises a patterned active layer, a source, and a drain; wherein the source and the drain are disposed at intervals in an extension direction of corresponding one of the plurality of data lines, the patterned active layer comprises a source contact region, the source is electrically connected to the patterned active layer corresponding to the source contact region, and the drain is electrically connected to a pixel electrode; and wherein an orthographic projection of the source on the substrate and an orthographic projection of the drain on the substrate are located within an orthographic projection of one of the plurality of data lines on the substrate;
   wherein the patterned active layer of the transistor is disposed in a region corresponding to one of the plurality of data lines; and
   wherein the display panel further comprises a first insulating layer disposed on the patterned active layer, the transistor further comprises a gate disposed on a surface of the first insulating layer and spaced apart with the source, and an upper surface of the source away from the substrate and an upper surface of the gate away from the substrate are in the same horizontal plane.

2. The display panel according to claim 1, wherein a first via hole is defined in the first insulating layer; and
   the source is electrically connected to a part of the patterned active layer corresponding to the source contact region through the first via hole, and the first via hole is defined in the region corresponding to one of the plurality of data lines.

3. The display panel according to claim 2, further comprising a second insulating layer disposed between the patterned active layer and one of the plurality of data lines, wherein the second insulating layer is further disposed on a side of the patterned active layer away from the first insulating layer; and
wherein the source and one of the plurality of data lines are electrically connected through a second via hole penetrating the first insulating layer and the second insulating layer, and the second via hole is defined in the region corresponding to one of the plurality of data lines.

4. The display panel according to claim 1, wherein the patterned active layer further comprises a drain contact region;
wherein the display panel further comprises:
a third insulating layer disposed between the patterned active layer and the drain, and a third via hole defined in the third insulating layer;
wherein the drain is electrically connected to a part of the patterned active layer corresponding to the drain contact region through the third via hole, and the third via hole is defined in the region corresponding to one of the plurality of data lines.

5. The display panel according to claim 4, further comprising a fourth insulating layer disposed between the drain and the pixel electrode, wherein a fourth via hole is defined in the fourth insulating layer;
wherein the pixel electrode and the drain are electrically connected through the fourth via hole, and the fourth via hole is defined in the region corresponding to one of the plurality of data lines.

6. The display panel according to claim 5, wherein the fourth insulating layer covers the drain, and the pixel electrode is disposed on the fourth insulating layer;
wherein the display panel further comprises:
a fifth insulating layer, and the fifth insulating layer covers the pixel electrode and the fourth insulating layer; and
a common electrode, and the common electrode is disposed on the fifth insulating layer.

7. The display panel according to claim 5, wherein the fourth insulating layer comprises a first passivation layer and a second passivation layer, the first passivation layer covers the drain, the second passivation layer is disposed on a side of the first passivation layer away from the drain, and the pixel electrode is disposed on the second passivation layer;
wherein the display panel further comprises:
a common electrode disposed on the first passivation layer.

8. The display panel according to claim 1, wherein the patterned active layer is disposed parallel to corresponding one of the plurality of data lines.

9. The display panel according to claim 1, wherein a thickness of one of the plurality of data lines is greater than 500 Å.

10. The display panel according to claim 1, further comprising a common electrode;
wherein the common electrode is disposed on a side of the pixel electrode away from the transistor, or the pixel electrode is disposed on a side of the common electrode away from the transistor.

11. The display panel according to claim 1, wherein in a plan view, both of the patterned active layer and corresponding one of the plurality of data lines are in linear strip shapes.

12. The display panel according to claim 1, wherein in a plan view, the source is in a linear strip shape and parallel to corresponding one of the plurality of data lines.

13. The display panel according to claim 1, wherein the source and the gate are disposed in a same layer and arranged at intervals.

14. The display panel according to claim 1, wherein the source and the gate are disposed in a same layer and arranged at intervals; and
wherein the drain is disposed in different layers from the source, and the drain is disposed on a side of the source away from the substrate.

15. The display panel according to claim 1, further comprising a scan line, wherein the scan line and the source and are disposed in a same layer and arranged at intervals, and the scan line perpendicularly intersects a channel region of the patterned active layer.

16. The display panel according to claim 1, further comprising a third insulating layer disposed on the source away from the substrate, wherein the drain comprises a first drain portion and a second drain portion connected to the first drain portion, the first drain portion is disposed on a surface of the third insulating layer away from the substrate, and the second drain portion penetrates a third via hole of the third insulating layer and is connected to the patterned active layer;
the gate is disposed on a surface of the first insulating layer and spaced apart with the source; and
in a direction perpendicular to the substrate, an orthographic projection of the source on the second drain portion overlaps with an orthographic projection of the gate on the second drain portion.

17. A display panel comprising:
a substrate;
a plurality of data lines disposed on the substrate; and
a transistor disposed on the substrate and electrically connected to one of the plurality of data lines, wherein the transistor comprises a patterned active layer, a source, and a drain; wherein the source and the drain are disposed at intervals in an extension direction of corresponding one of the plurality of data lines, the patterned active layer comprises a source contact region, the source is electrically connected to the patterned active layer corresponding to the source contact region, and the drain is electrically connected to a pixel electrode; and wherein an orthographic projection of the source on the substrate and an orthographic projection of the drain on the substrate are located within an orthographic projection of one of the plurality of data lines on the substrate;
wherein the patterned active layer of the transistor is disposed in a region corresponding to one of the plurality of data lines; and
wherein the display panel further comprises a first insulating layer disposed on the patterned active layer, and the transistor further comprises a gate disposed on a surface of the first insulating layer and spaced apart with the source; and
an upper surface of the source away from the substrate is flush with an upper surface of the gate away from the substrate.

18. The display panel according to claim 1, wherein a minimum value of the width of each of the repeating units is 4 microns.

19. The display panel according to claim 1, wherein a first via hole is defined in the first insulating layer; and wherein the source comprises a first source portion and a second source portion connected to the first source portion, the first source portion is disposed on a surface of the first insulating layer away from the substrate, and the second source portion penetrates the first via hole and is connected to the patterned active layer; and in a plan view, extension directions of the patterned active layer, the first source portion, and corresponding one of the plurality of data lines are the same, and both of an orthographic projection of the patterned active layer on the substrate and an orthographic projection of the first source portion on the substrate are located within an orthographic projection of corresponding one of the plurality of data lines on the substrate.

* * * * *